United States Patent [19]

Malm

[11] Patent Number: 4,695,715
[45] Date of Patent: Sep. 22, 1987

[54] INFRARED IMAGING ARRAY EMPLOYING METAL TABS AS CONNECTING MEANS

[75] Inventor: Robert E. Malm, Pacific Palisades, Calif.

[73] Assignee: Northrop Corporation, Hawthorne, Calif.

[21] Appl. No.: 808,209

[22] Filed: Dec. 12, 1985

[51] Int. Cl.⁴ ............................................... H01J 40/14
[52] U.S. Cl. .................................. 250/211 J; 250/578; 357/24 LR
[58] Field of Search .................. 357/24 LR, 32, 30 H; 250/211 R, 578, 370 G, 338 SE, 211 J

[56] References Cited

U.S. PATENT DOCUMENTS

| | | | |
|---|---|---|---|
| 4,360,732 | 11/1982 | Chapman et al. | 250/332 |
| 4,369,372 | 1/1983 | Yoshioka et al. | 250/578 |
| 4,389,661 | 6/1983 | Yamada | 357/24 |
| 4,394,675 | 4/1983 | Anagnostopoulos et al. | 357/24 |
| 4,467,340 | 8/1984 | Rode et al. | 357/24 |
| 4,513,313 | 4/1985 | Kinoshita et al. | 358/44 |
| 4,521,798 | 6/1985 | Baker | 357/30 |
| 4,531,225 | 7/1985 | Ohtsuki | 377/58 |
| 4,583,108 | 4/1986 | Sirieix | 357/30 |
| 4,603,258 | 7/1986 | Sher et al. | 250/370 |
| 4,603,342 | 7/1986 | Savoye et al. | 357/24 |

Primary Examiner—David C. Nelms
Assistant Examiner—William L. Oen
Attorney, Agent, or Firm—Terry J. Anderson; Robert B. Block

[57] ABSTRACT

An infrared radiation detection device utilizing an array of metal electrodes deposited on the insulated surface of a suitable semiconductor material such as an indium antimonide substrate. The detector electrodes are read out by discharging each electrode to a preselected voltage through an integrating capacitor. The charge accumulated on each integrating capacitor is related to the charge collected at the insulator substrate interface under each detector electrode due to interaction of the infrared radiation with the indium antimonide substrate. The integrating capacitors and related charging and switching circuitry are located on a silicon substrate. The integrating capacitors and related circuitry on the silicon substrate are connected to the detector electrodes on the indium antimonide substrate by means of an array of metal tabs fabricated on the silicon substrate and deflected to contact the detector electrodes by electrostatic attraction. Each detector electrode and associated metal tab is isolated from the switching and charging circuitry and row connectors by a metal-oxide-semiconductor-field-effect transistor fabricated adjacent to each tab on the silicon substrate. The isolation provided by the MOSFETs avoids cross-talk between the various detectors in the array and avoids the diminution of the signals from the elements by the capacitance associated with row and/or column connectors.

7 Claims, 27 Drawing Figures

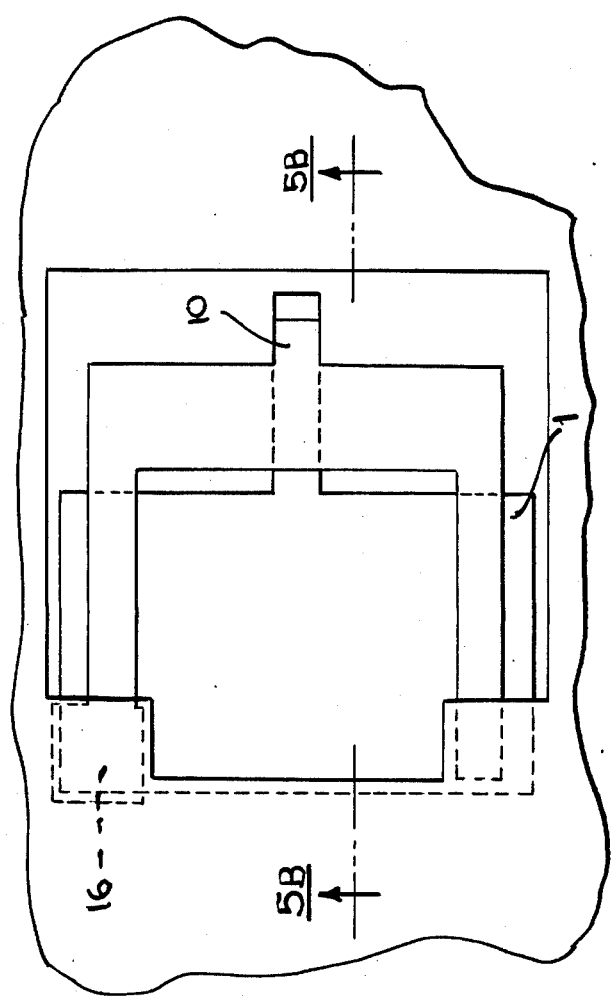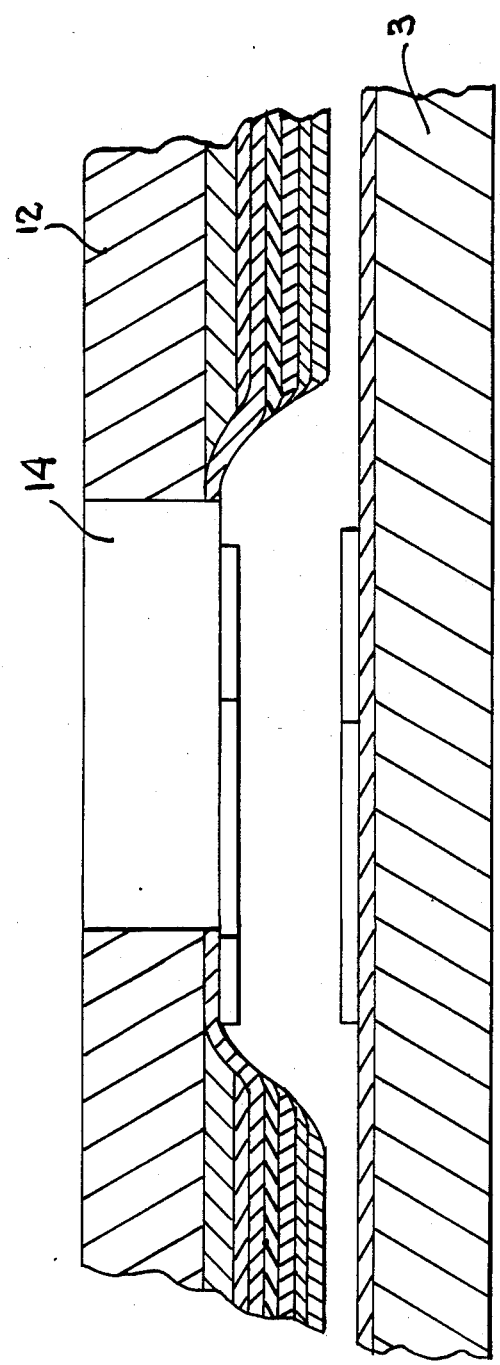
Fig.5A
Fig.5B

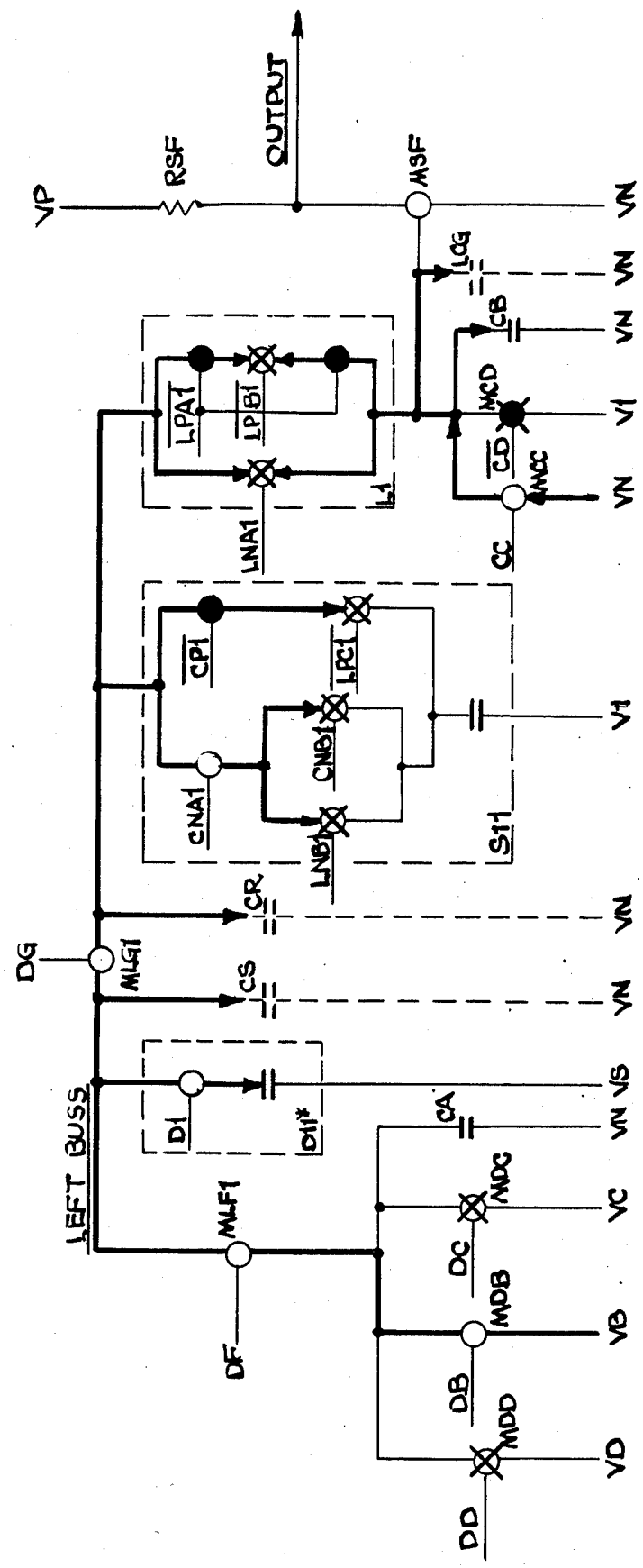
Fig. 12 — BIASING OF STRAY CAPACITANCE PRIOR TO INTEGRATING CAPACITOR READOUT

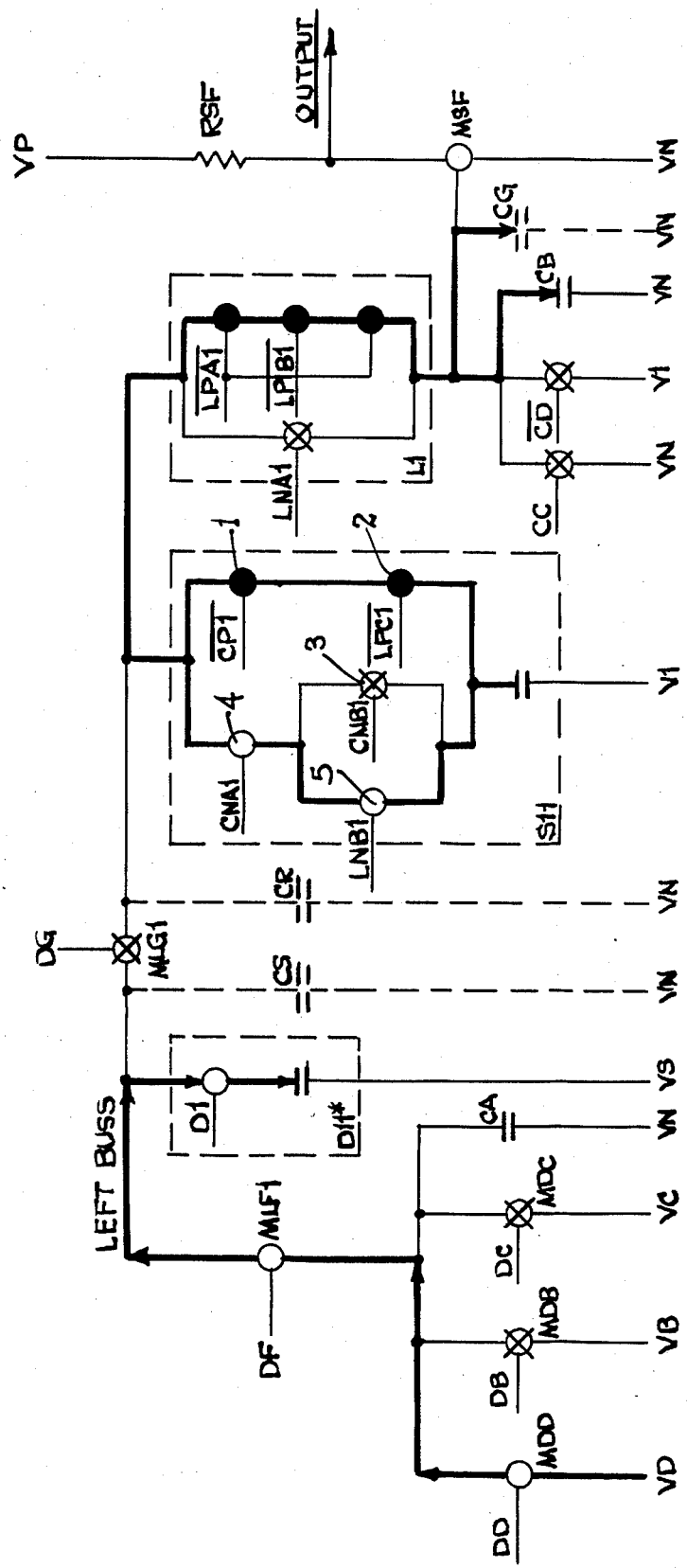
Fig.13 INTEGRATING CAPACITOR READOUT; DETECTOR CHARGE DUMP

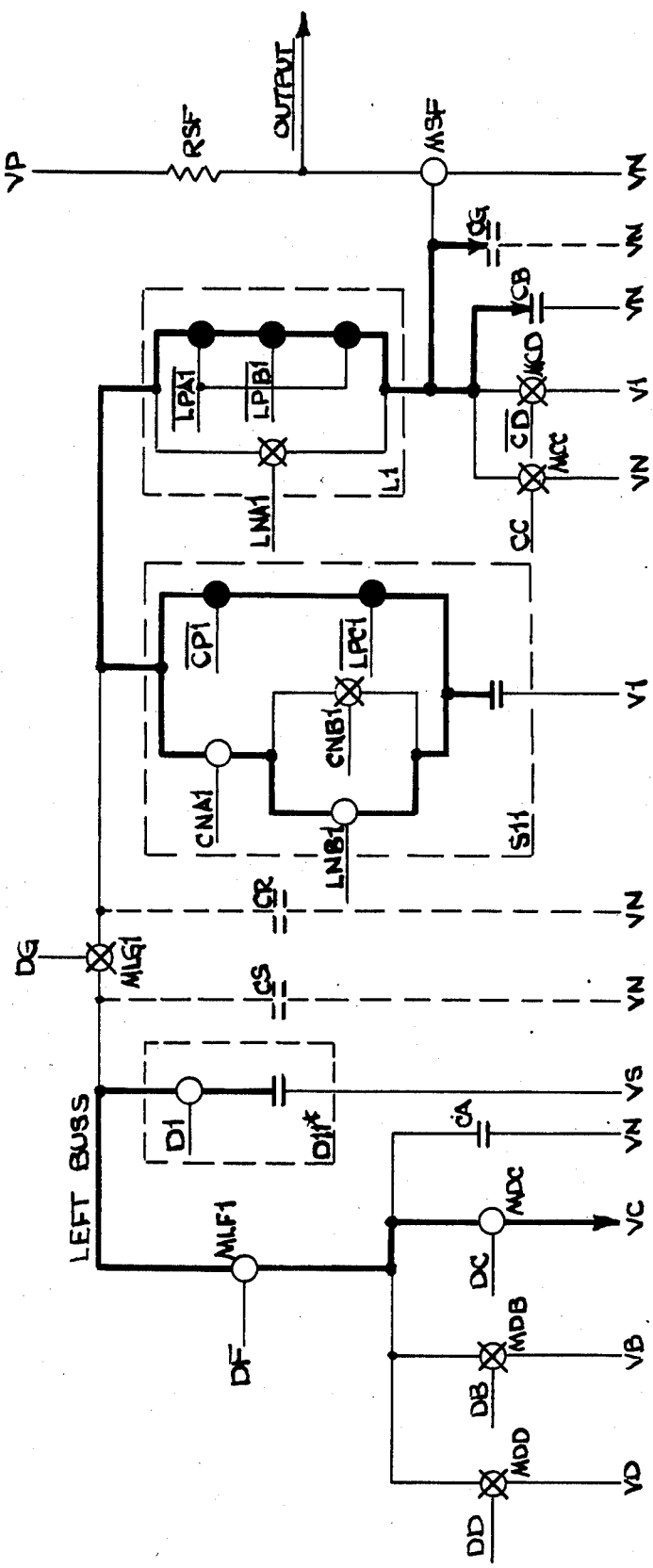
Fig. 14 — INTEGRATING CAPACITOR READOUT; DETECTOR CHARGING

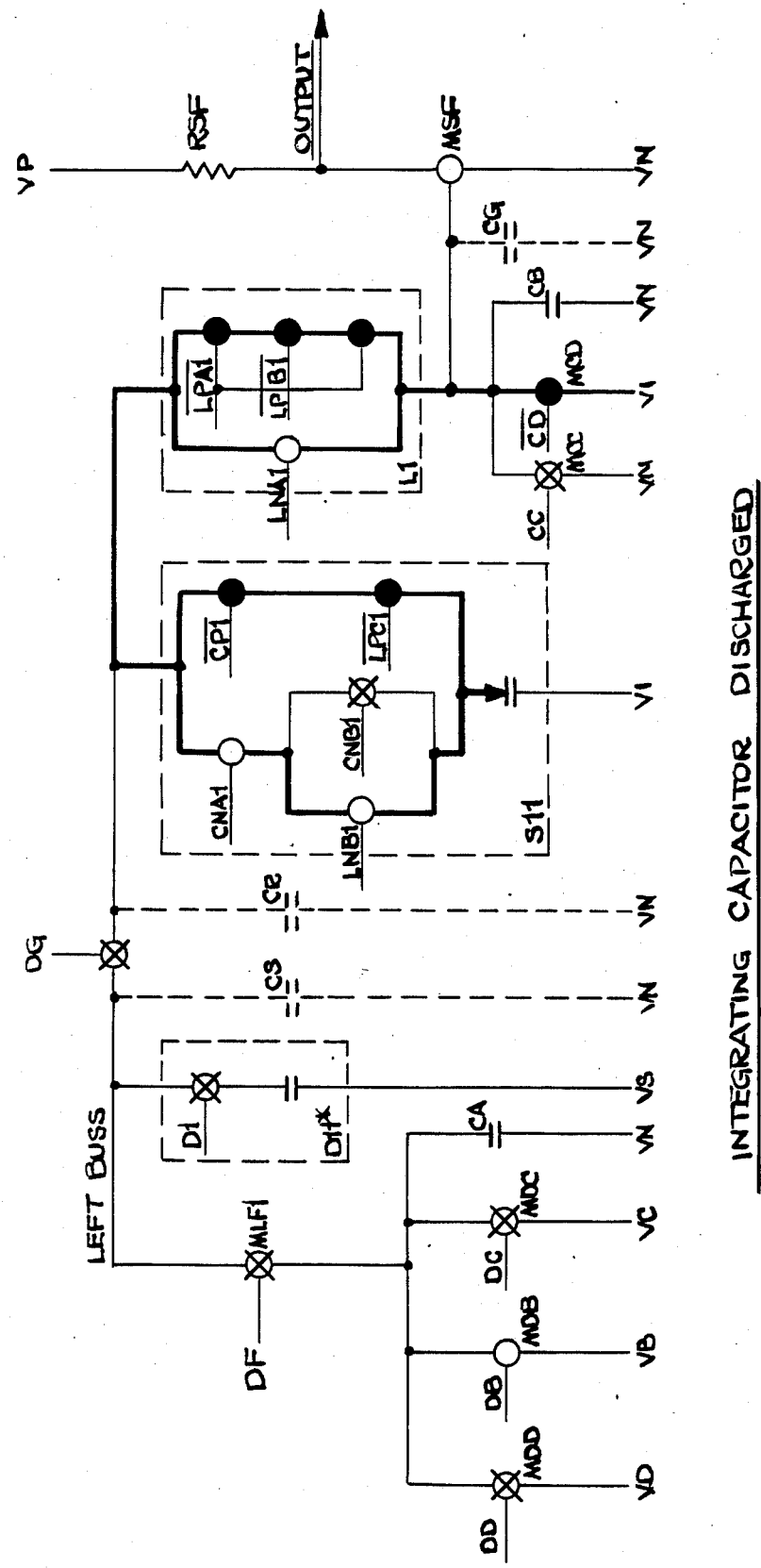

INFRARED IMAGING ARRAY EMPLOYING METAL TABS AS CONNECTING MEANS

BACKGROUND OF THE INVENTION

1. Field of the Invention

This invention pertains to semiconductor infrared radiation detectors. More particularly, this invention pertains to metal-insulator-semiconductor (MIS) radiation detectors which detect infrared radiation by collecting charges generated within the semiconductor by the interaction of the radiation with the semiconductor.

2. Description of the Prior Art

Infrared radiation detection by means of metal-insulator-semiconductors and a technique for obtaining the outputs from the individual detectors in an array by a method referred to as the charge-injection device ("CID") technique have been described in U.S. Pat. No. 4,079,422 and by Burke and Michon, "Charge Injection Imaging: Operating Techniques and Performance Characteristics," IEEE Journal of Solid-State Circuits, pp. 121-128, vol. SC-11, No. 1, February 1976. A method for integrating the outputs of the detectors using the CID technique is described in U.S. Pat. No. 4,338,633. The integration of the outputs reduces the relative amount of noise associated with the output of each element in an array of radiation detectors while, at the same time, avoiding saturation of the individual detectors.

The readout of the outputs of an array of MIS detectors by means of the CID technique suffers from a number of problems which arise from the interactions or cross-talk between the elements in the array of detectors. The cross-talk is due to electrical connections between the elements of each row and between elements of each column in the array, which electrical connections are an integral part of the CID readout technique. In addition, capacitive coupling between the row and column conductors used in the CID technique causes additional cross-talk. The capacitance of the row and column connectors also significantly reduces the signal level of the outputs of the capacitor pairs that are used in the CID technique.

An additional practical problem occurs in the devices of the prior art. As described in U.S. Pat. No. 4,338,633, the rows and columns used for the readout of the array typically are connected by ordinary wire connections to the companion array of integrators. For an array having a significant number of elements, the difficulty in connecting the rows and columns of the array and the integrators by means of individual wires is significant.

SUMMARY OF THE INVENTION

The present invention uses a new and different method for obtaining the output from each semiconductor infrared radiation detector, which method does not depend upon the transfer of charge between pairs of capacitors connected respectively to row and column conductors. In the present invention, after the capacitor on the semiconductor substrate has been exposed to radiation, the amount of radiation incident upon each MIS capacitor is read directly by measuring the amount of charge that must be transferred to each individual capacitor in order to discharge the capacitor to the extent that its voltage is reduced to a predetermined level. The measure of charge obtained from the discharge of the MIS capacitor is accumulated in an integrating capacitor over a number of such discharges. The accumulated (integrated) measure of the output of each MIS capacitor then is read out to provide an output from the array of detectors. The electrical elements and circuitry described herein provide a means for reading out, and integrating the amount of radiation detected by each detector and for reinitializing each radiation detector in the array of radiation detectors also described herein.

The array of integrating capacitors and associated control circuitry is fabricated on a silicon substrate using MOS technology and is connected to the array of MIS radiation detectors on the semiconductor substrate by means of an array of metal tabs. The metal tabs are fabricated on the silicon substrate by deposition and etching techniques. Each metal tab is isolated from row and column interconnections on the silicon substrate by means of a metal-oxide-semiconductor-field-effect transistor (MOSFET) located adjacent to the tab and connecting the tab to the row connectors. The MOSFET isolates the tab and the associated MIS radiation detector from the capacitance of the row connector on the silicon substrate and isolates the detector from interactions with other detectors attached to the same row connector.

After the substrates have been cooled to the desired operating temperature, typically 77° K., the array of metal tabs are electrostatically deformed to make the electrical interconnections between the integrating capacitors on the silicon substrate and the MIS detectors on the semiconductor substrate. By making these connections after the substrates have cooled to the operating temperature, the invention avoids the problem of maintaining registration between dissimilar substrates over wide ranges of temperature.

BRIEF DESCRIPTION OF THE DRAWINGS

FIGS. 4 through 7 depict the tabs that are used to interconnect the detectors and the integrating capacities;

FIGS. 10 through 15 are reproductions of FIG. 9 which have been marked to show the "on" and "off" states of certain transistors and the paths of the current flow within the circuitry at various stages of operation of the system;

DESCRIPTION OF THE PREFERRED EMBODIMENT

Figure 1:
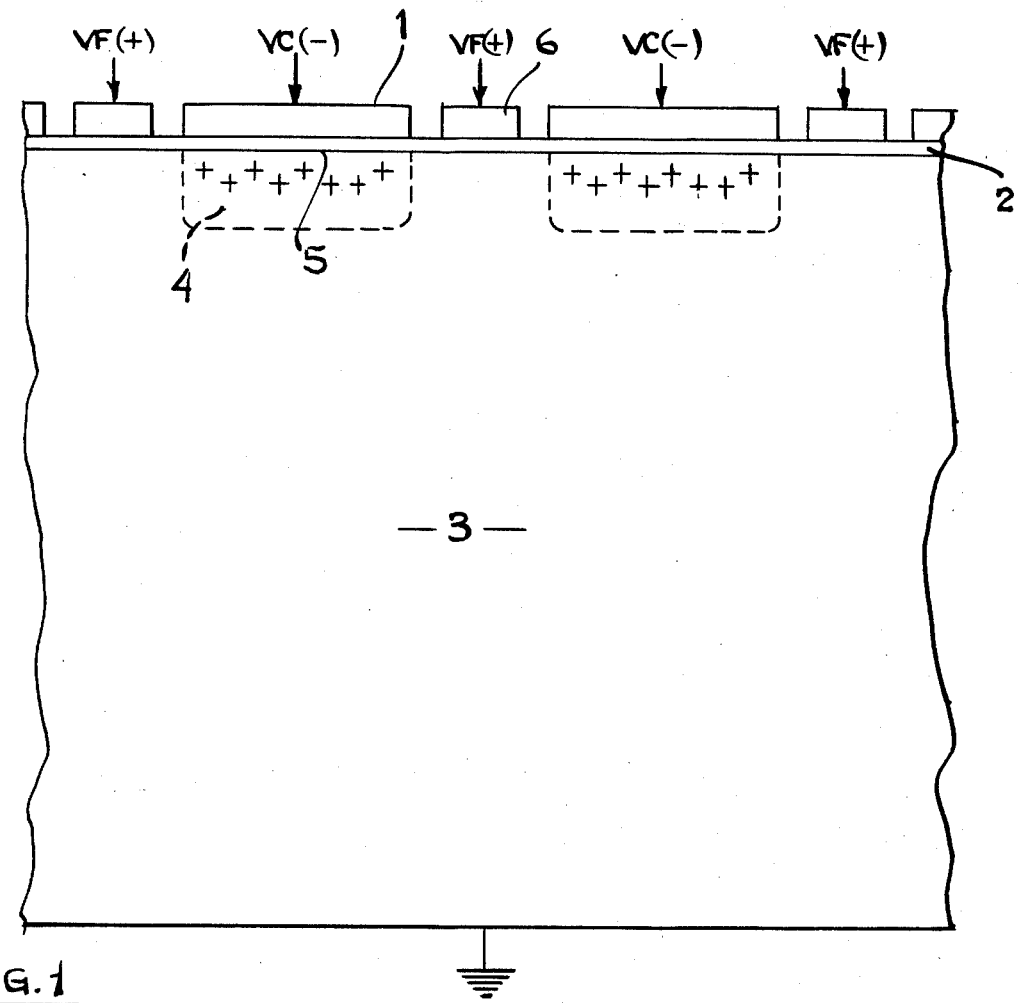
FIG. 1 depicts a typical MIS detector on a semiconductor substrate.

FIG. 1 illustrates the structure of the basic MIS infrared radiation detector of the preferred embodiment. An array of metal squares, of which electrode 1 in FIG. 1 is representative, is fabricated by means of vacuum deposition on an insulating layer 2 at the surface of an n-type semiconductor substrate 3. Substrate 3 is connected to ground, that is to the zero reference potential for the system. When a negative voltage is impressed on electrode 1, the negative voltage creates a depletion layer 4 beneath electrode 1 in substrate 3. The negative voltage on electrode 1, repels mobile electrons within the substrate leaving a layer of bound positive charges within the depletion layer.

Figure 19A:
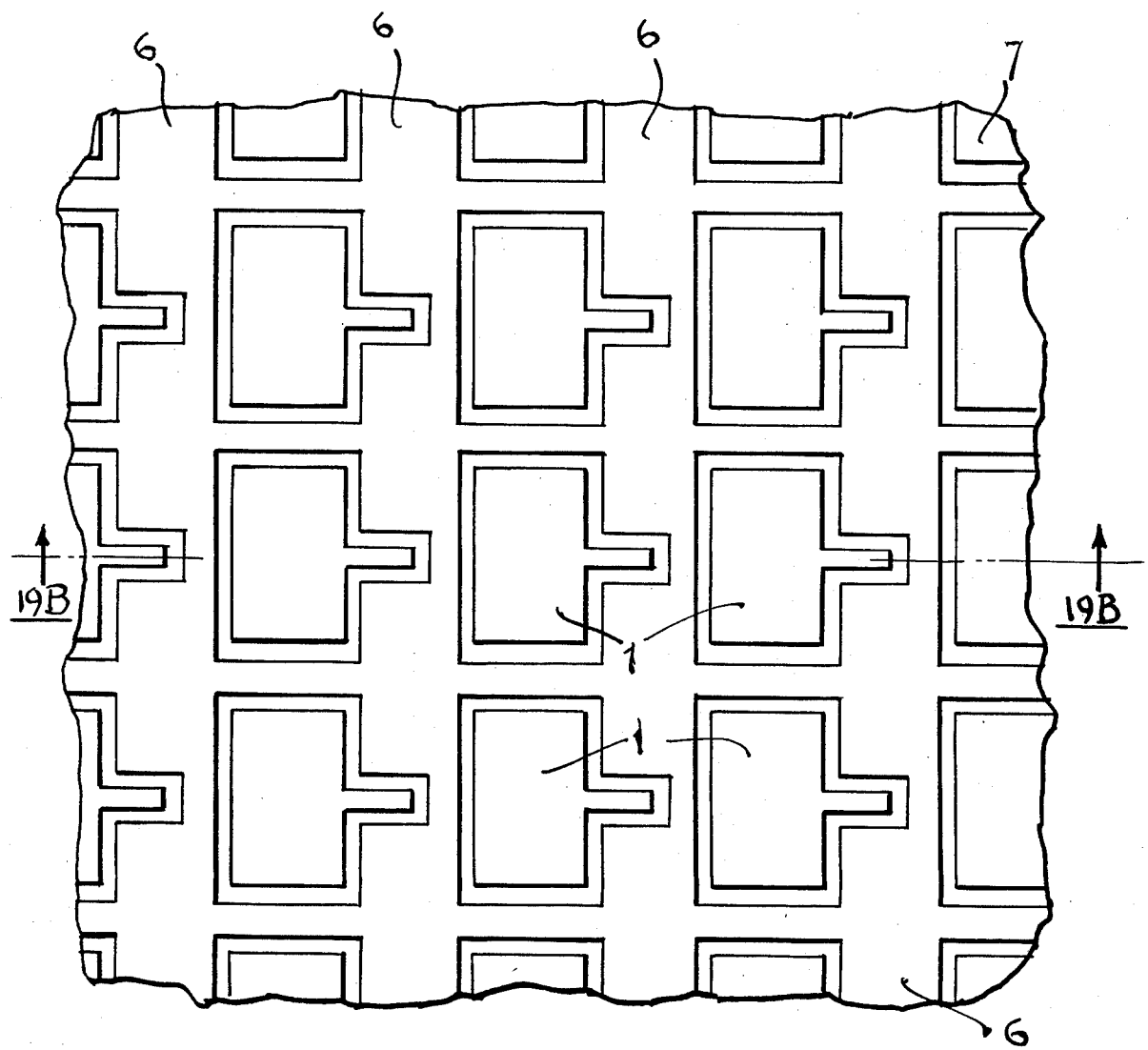
FIG. 19 depicts the layout of the detector array.
Figure 19B:
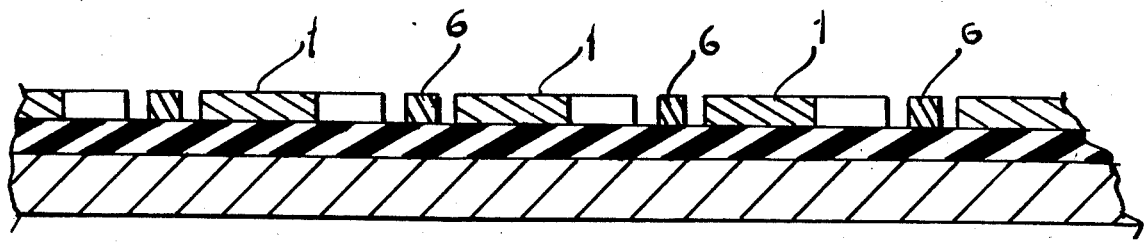

In operation as a detector, after creation of the depletion layer, electrode 1 is "floated" electrically and the substrate then is exposed to infrared radiation. The radiation passes through electrode 1, which is substantially transparent to the radiation, and into the substrate. The radiation interacts with the substrate and generates mobile pairs of holes and electrons within the depletion layer. Although the radiation also generates a few electron-hole pairs elsewhere, most of the radiation is absorbed within the depletion layer and most of the generation occurs within this layer. The holes are attracted by the negative potential of electrode 1 and migrate to the boundary surface 5 between insulator 2 and substrate 3. The accumulation of positive changes along the surface 5 of insulator 2 reduces the potential of electrode 1 relative to substrate 3 and, as a consequence, reduces the extent of depletion layer 4. Electrode 1 is separated from its neighbor by a guard ring 6 which is maintained at a positive potential relative to substrate 3. The positive potential creates accumulation regions of electrons beneath the guard rings which accumulation regions serve to isolate the detectors from one another. FIGS. 19A and 19B depict an array of detector electrodes 7, of which electrode 1 (in FIG. 1) is representative, that is deposited on an insulating layer ($S_iO_2$ typically) on the top of the substrate. The guard ring 6, depicted in FIG. 1, is seen in FIG. 19 to constitute, in the aggregate, a mask that isolates each electrode in the array of electrodes from the adjacent electrodes.

The voltage on electrode 1 relative to substrate 3 is given by the equation $$V = \frac{Q_E}{C_o} - \frac{eN_D}{2\epsilon} X^2 \qquad (1)$$

where
$Q_E$—electrode charge per unit area (a negative number)
$C_o$—electrode insulator capacitance per unit area
$N_D$—donor impurity density in semiconductor
$e$—electron charge (a positive number)
$\epsilon$—permittivity of semiconductor
$X$—depletion depth
Furthermore, $$Q_E + Q = -eN_D X \qquad (2)$$

where
$Q$ = photon-generated positive charge per unit area beneath electrode at insulator-semiconductor interface
$eN_D X$ = semiconductor space charge per unit area in depletion region
Substituting for X in equation (1), one obtains $$V = \frac{Q_E}{C_o} - \frac{1}{2EeN_D}(Q_E + Q)^2 \qquad (3)$$

When the depletion region 4 is first established (by changing the electrode voltage from zero to some negative voltage), Q is equal to zero and V is given by the expression $$V = \frac{Q_E}{C_o} - \frac{1}{2EeN_D} Q_E^2 \qquad (4)$$

As Q increases with time because of incident radiation, the quantity ($Q_E + Q$) decreases and V increases (i.e., V becomes less negative). Because electrode 1 is floating, the collection of the positive charges generated by the infrared radiation causes the absolute magnitude of the voltage, V, to decrease with continuing exposure to radiation. When $Q_E + Q = 0$, the depletion region vanishes and the detector "saturates". The corresponding voltage at saturation is given by the expression $V = Q_E/C_o$.

The detector is read out by measuring the amount of charge, $Q_E$ that must be placed on the detector electrode to discharge the detector partially to a preselected voltage. By appropriate selection of the initial electrode voltage and of the voltage to which the electrode is partially discharged, a nearly linear relationship can be obtained between the charge which is transferred to the electrode to reduce the voltage to the preselected level, and the amount of charge which is accumulated at the surface 5 of insulator 4 due to incident radiation.

The voltage change $\Delta V$ associated with a change $\Delta Q_E$ in electrode charge is given by the equation $$V + \Delta V = \frac{Q_E + \Delta Q_E}{C_o} - \frac{1}{2EeN_D}(Q_E + \Delta Q_E + Q)^2 \qquad (5)$$

To simplify notation, the following quantities are defined:

$$Q_N = \frac{Q}{(-Q_E)} \qquad (6)$$

$$\Delta Q_{EN} = \frac{\Delta Q_E}{(-Q_E)} \qquad (7)$$

$$P = \frac{EeN_D}{C_o(-Q_E)} \qquad (8)$$

$$Q_{BN} = \frac{C_o \Delta V}{(-Q_E)} \qquad (9)$$

Subtracting equations (4) and (5) and expressing the result in terms of the quantities above, one obtains $$\Delta Q_{EN}^2 - 2(P + 1 - Q_N)\Delta Q_{EN} + (2PQ_{BN} + Q_N^2 - 2Q_N) = 0 \qquad (10)$$

Solving for $\Delta Q_{EN}$ one obtains $$\Delta Q_{EN} = (P + 1 - Q_N) - \sqrt{(P + 1)^2 - 2P(Q_N + Q_{BN})} \qquad (11)$$

For the preferred embodiment having a $SiO_2$ insulator and an InSb semiconductor, typical parameter values are:

$E = 1.5 \times 10^{-12} F/cm$ $N_D = 2 \times 10^{14}/cm^3$ $C_o = 3 \times 10^{-8} F/cm^2$ $$e = 1.6 \times 10^{-19} C$$

$$Q_E = -1.8 \times 10^{-8} C/cm^2$$

Substituting these values in equation (4) and (8), one finds that

V = 3.975
P = 0.089

If one arranges for the quantity under the square root sign in equation (11) to be zero by selection of $Q_{BN}$ then $$\Delta Q_{EN} = P + 1 - Q_N = 1.089 - Q_N \quad (12)$$

Thus, $\Delta Q_{EN}$ (the normalized change in electrode charge associated with an electrode voltage change of $\Delta V$) can be used as a measure of the normalized charge $Q_N$ generated by photons. The normalized charge $Q_N$ generated by photons can range from zero to one which would result in the normalized change in electrode charge $Q_N$ ranging between 0.089 to 1.089. Thus, $\Delta Q_{EN}$ (which results from photon-generated charge Q and a change in electrode voltage $\Delta V$) is a perfectly satisfactory measure of $Q_N$.

One can calculate the required voltage change $\Delta V$ to achieve this result by setting the quantity under the square root sign in equation (11) equal to zero and by solving for $Q_{BN}$.

$$Q_{BN} = \frac{(P+1)^2}{2P} - Q_N \quad (13)$$

Using the previously-calculated value for P, one finds that Q is given by $$Q_{BN} = 6.66 - Q_N \quad (14)$$

To realize the linear relationship betwen $\Delta Q_{EN}$ and $Q_N$ given by equation (12), $Q_{BN}$ would range from 5.66 to 6.66. Because one has no prior knowledge of $Q_N$ one must therefore select some constant value of $Q_{BN}$ and to assure a real solution for $Q_N$ in terms of $Q_{EN}$, one must choose the lowest value in the range for $Q_{BN}$, i.e. 5.66.

Figure 2:
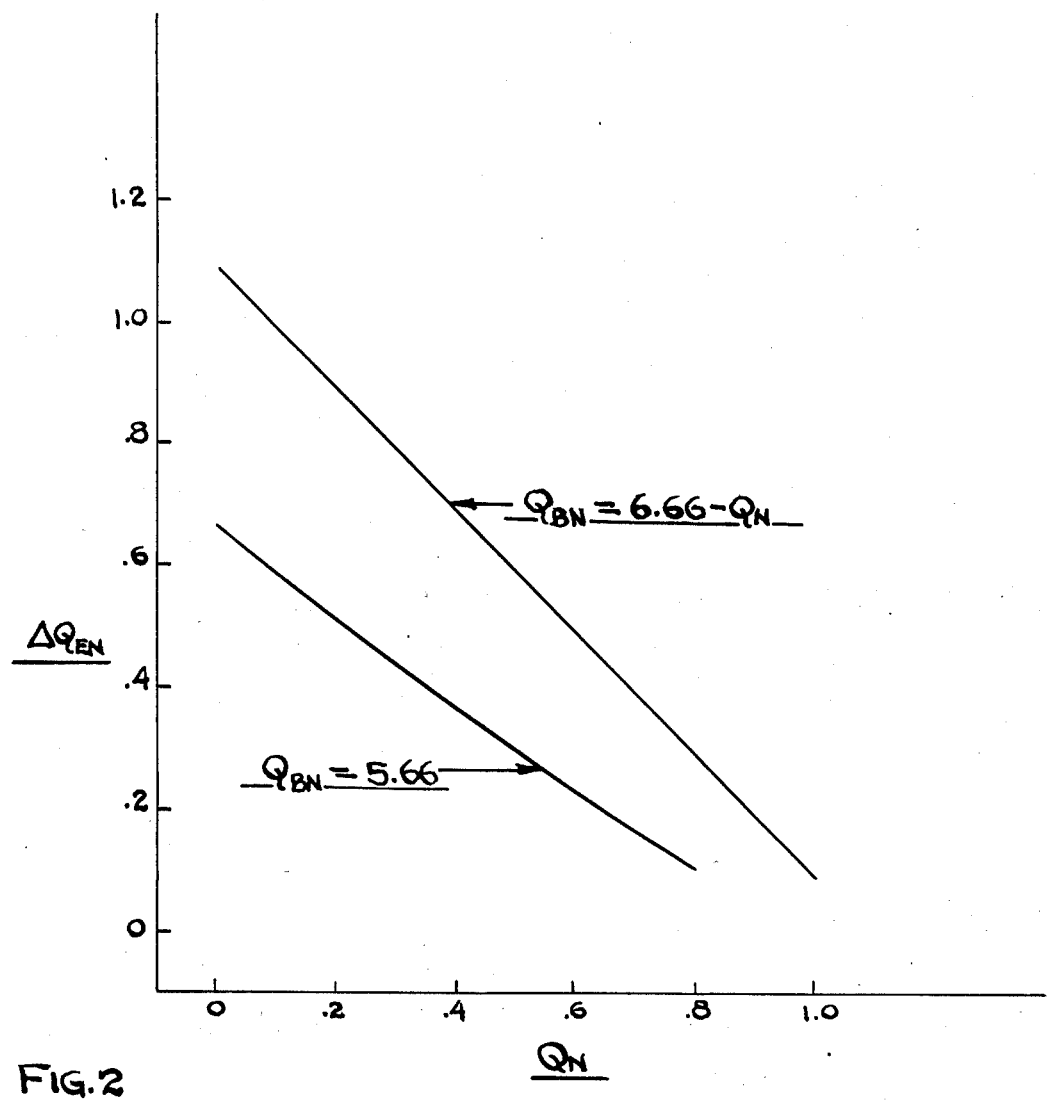
FIG. 2 depicts the relationship between $\Delta Q_{EN}$ and $Q_n$ for specified values of $Q_{BN}$.

Plots of $\Delta Q_{EN}$ as a function of $Q_N$ for the ideal case where $Q_{BN}$ is given by equation (14) and the practical situation where $Q_{BN}=5.66$ are shown in FIG. 2. The latter case is very nearly linear so long as one does not approach detector saturation ($Q_N=1$) too closely.

One may then determine what the value of 5.66 for $Q_{BN}$ corresponds to in terms of electrode voltage change $\Delta V$. From equation (9) and the previously-given parameter values, $\Delta V = 3.396$ volts. Thus, if the electrode is discharged from $-3.975$ volts to $-3.975 + 3.396 = -0.579$ volts, the quantity of charge transferred, $\Delta Q_{EN}$, will be related to the photon-generated charge $Q_N$ by the lower curve in FIG. 2.

It is then apparent how to devise a circuit for determining the accumulated photon-generated charge Q collected under the detector electrode by measuring the amount of charge $\Delta Q_E$ that must be transferred to the cell electrode to reduce the voltage to 0.579 volts.

Figure 3:
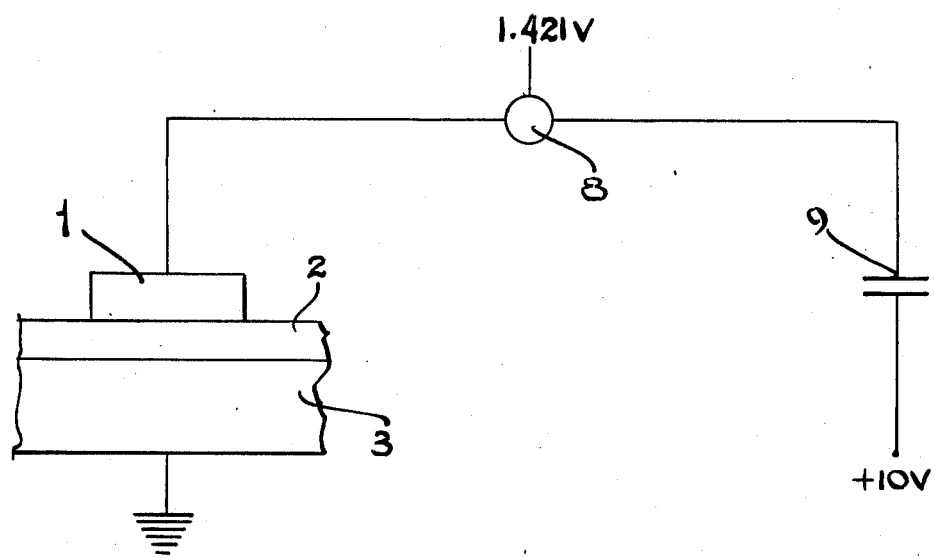
FIG. 3 depicts a simplified circuit for the readout of a MIS detector.

The essence of the circuit is shown in FIG. 3. At readout time the electrode of the MIS detector is connected through an N-type MOSFET 8 and a integrating capacitor 9 to a large positive voltage. Current immediately begins to flow from the positive supply to the detector and continues until the voltage on the detector electrode 1 reaches $-0.579$ volts, at which point the MOSFET's gate-to-source voltage equals the threshold voltage and MOSFET 8 cuts off. A charge equal to the charge $\Delta Q_E$ that has been transferred to the detector electrode also now resides on capacitor 9. Thus, the change in voltage across capacitor 9 which is due to the change in the charge on the capacitor is a measure of $\Delta Q_E$ and also of the photon-generated charge Q in the detector after being offset by 1.089 $Q_E$ (see equation (12) and the definitions of $\Delta Q_{EN}$ and $Q_N$).

By repeating, a number of times, the process described above, one finds that the $\Delta Q_E$s are summed on capacitor 9 so that the circuit also provides the means for accomplishing the integration process as part of the readout of the detector.

Unfortunately the semiconductor materials that are suitable for infrared radiation detectors are not suitable vehicles for integrated circuitry. Accordingly, in the preferred embodiment of this invention, two substrates made of different materials are used. For example, an indium antimonide (InSb) semiconductor uctor substrate having an insulating surface layer of silicon dioxide ($SiO_2$) could be used as the substrate and the insulating layer for the infrared radiation detectors. A silicon substrate is used for the fabrication of the integrating capacitors and for the fabrication of the field effect transistors on the silicon substrate (MOSFETS) that are used as switches in the integrating, control and readout circuitry.

Figure 4:
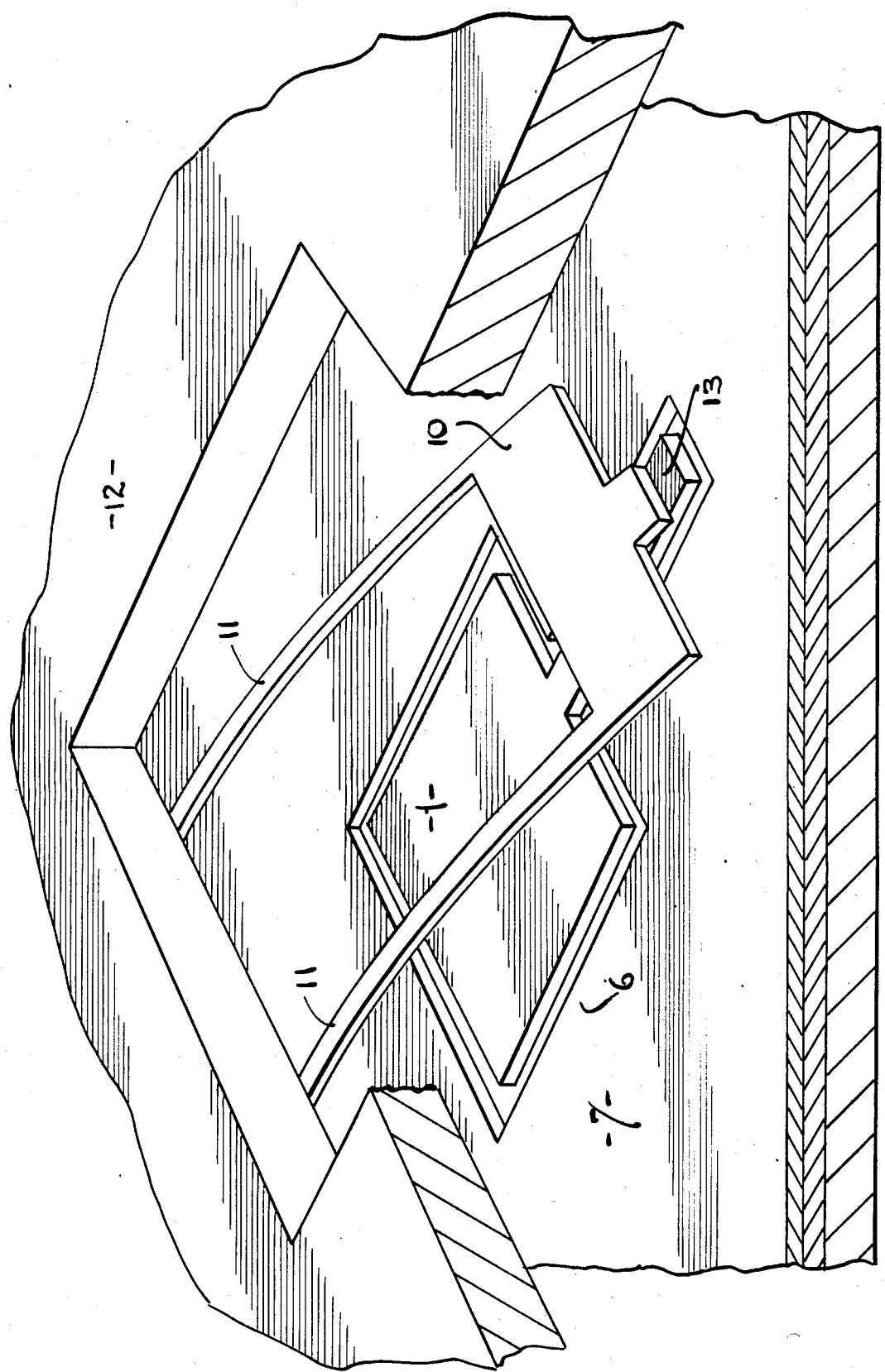
Figure 7A:
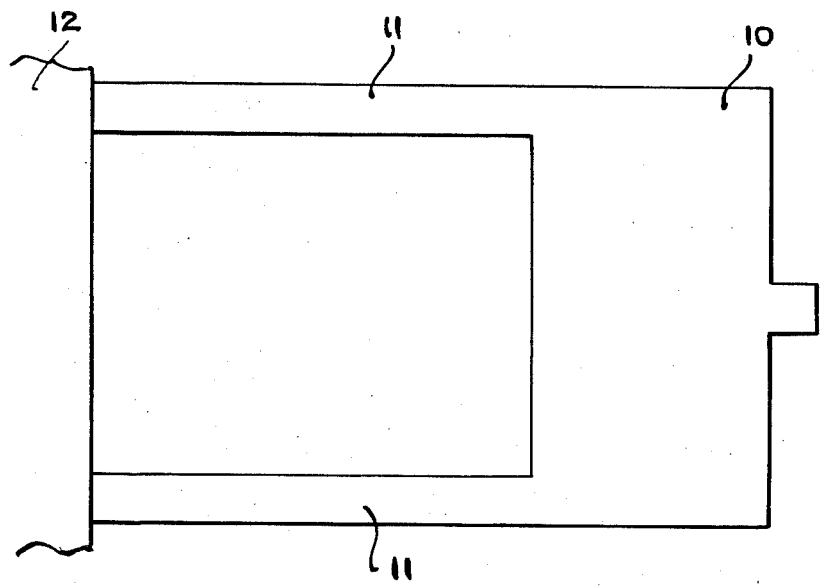
Figure 7B:
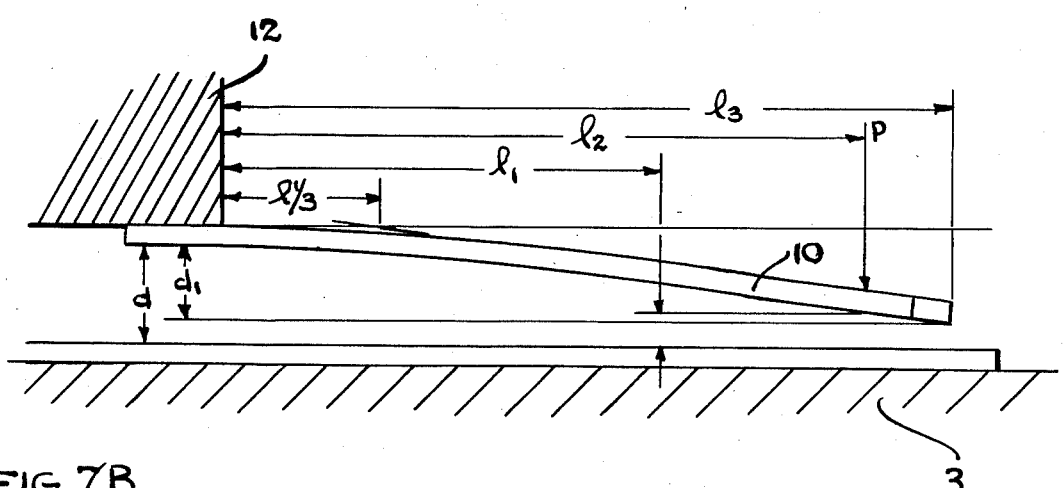

In order to connect the integrating capacitors and readout circuitry located on the silicon substrate to the array of radiation detectors located on the indium antimonide substrate, the preferred embodiment utilizes an array of metal tabs that are fabricated on the silicon substrate. A technique for the fabrication of an array of thin metal tabs on a silicon substrate has been described by Kurt E. Petersen in "Dynamic Micromechanics on Silicon: Techniques and Devices", IEEE Transactions on Electron Devices, Vol. ED-25, No. 10, October 1978, pp. 1241 et seq. One end of each tab is attached to the silicon substrate while the remainder of the tab is free to bend away from the substrate. The tabs are fabricated by deposition of metal on the substrate and then by undercutting the portions of the tabs which are to be movable by the etching processes described by Petersen. FIG. 4 depicts one tab 10 of the array of tabs that are used for connecting each of the MOSFETS on the the silicon substrate 12 to each detector electrode 1 on the indium antimonide substrate. The end 11 of tab 10 remains attached to the silicon substrate 12. When a positive voltage with respect to tab 10 is applied to guard ring 6, the moveable portion of each tab 10 is attracted electrostatically toward the guard ring, thus causing each tab to bend towards, and come into electrical contact with, the extended portion 13 of its associated electrode 1. FIG. 7B depicts a side view of one of the tabs 10. FIG. 5A is a top view of one of the tabs 10 showing the orientation of the tab relative to the underlying electrode 1. As depicted in FIGS. 5A and 5B, a window 14 is etched in silicon substrate 12 over each tab 10 and is oriented above detector electrode 1 so that infrared radiation may pass through the window to reach the electrode. Silicon substrate 12 actually has an array of such windows 14 arranged to coincide with the array of tabs and with the array of detector electrodes on the underlying indium antimonide substrate 3. FIG. 5 further depicts the contact 16 to active area of the silicon substrate upon which the MOSFET Transistor 8 is fabricated, which transistor (depending on its gate voltage), either connects tab 10 to, or isolates tab 10 from, connections on substrate 15 that run to the associated switching and integrating circuitry. FIG. 5B depicts the sequence of depositing the layers of material on the silicon substrate in connection with the fabrication of the active elements, the conductors and the tabs on the substrate. After fabrication of the tabs and the active areas on the silicon substrate, the windows 14 are etched through the substrate from the opposite side of the substrate.

Figure 6:
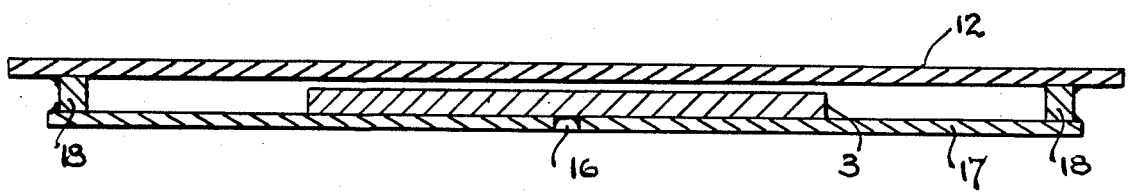

FIG. 6 depicts the method by which the detector array on the silicon antimonide substrate 3 is attached to the silicon substrate. Substrate 3 is attached to mounting platform 17 by means of a central "dot" of cement 16. For the purpose of matching thermal expansion coefficients, mounting platform 17 also is made of silicon. Mounting platform 17, in turn, is attached at its edges by mounting blocks 18 to the silicon substrate 12 upon which the readout circuitry and tabs are fabricated. By attaching substrate 3 at its center to mounting platform 17, the detector array substrate 3 is free to expand and contract with temperature change. In order to have the tabs that are located on substrate 12, register properly with the detector electrodes on substrate 3, the entire structure is first cooled to the operating temperature (typically 77° K.) before a voltage is applied to the guard ring 6 on the detector substrate to cause the tabs to deflect from the silicon substrate and into contact with the electrodes.

An array of 256 by 256 detectors is used in the preferred embodiment. The dimensions of the tabs in the preferred embodiment are shown in FIGS. 7A and 7B and typical values for these dimensions are given in Table I.

TABLE I

| |
|---|
| $b = 3 \times 10^{-6}$ m |
| $h = 0.2 \times 10^{-6}$ m |
| $A = 126 \times 10^{-12}$ m$^2$ |
| $d = 2 \times 10^{-6}$ m |
| $l_1 = 15 \times 10^{-6}$ m |
| $l_2 = 22 \times 10^{-6}$ m |
| $l_3 = 25 \times 10^{-6}$ m |
| $\epsilon_0 = 8.854 \times 10^{-12}$ F/m (permittivity of free space) |
| $E = 7 \times 10^{10}$ N/m$^2$ (Young's modulus for Al) |

For the values given in Table I, a voltage of approximately 13 volts on the guard rings relative to tab voltage is just sufficient to cause deflection of the tabs. Accordingly, a voltage of approximately 25 volts gives a sufficient margin of safety to operate the tabs.

Figure 8:
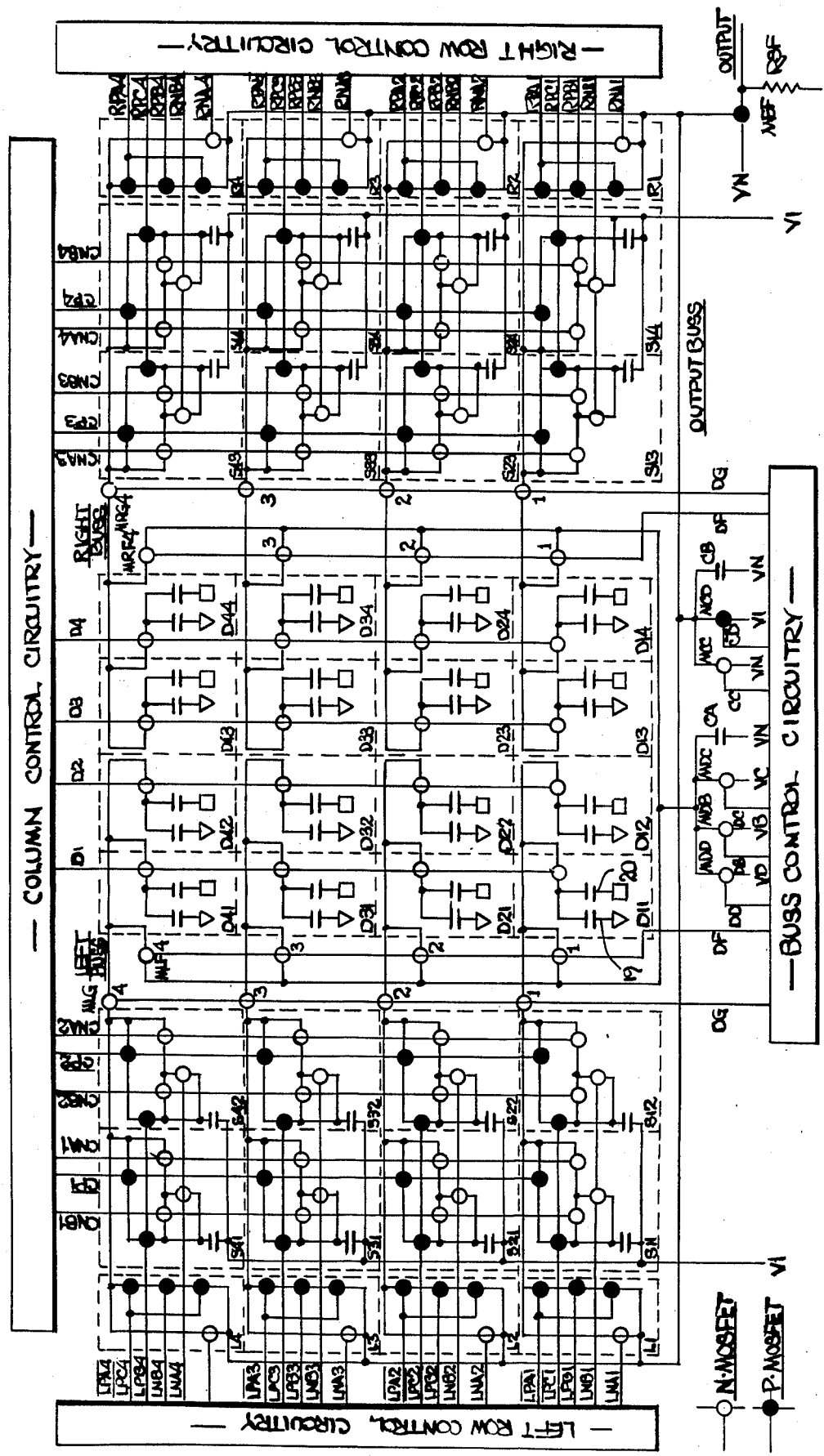
FIG. 8 shows the readout and frame integrated circuitry for a 4×4 detector array.

The readout and frame integrator circuitry, based on the simple circuit illustrated in FIG. 3, is illustrated in FIG. 8 for a 4×4 detector array. In the preferred embodiment, the configuration illustrated in FIG. 8 is expanded to an array of 256×256 elements. The central area of FIG. 8 depicts an array of "D" type modules numbered by the row and column in which they are located. The capacitor 19 in module D11 denotes an MIS detector cell. Adjacent capacitor 20 terminated with a "square" denotes the capacitance between the guard ring 6 depicted in FIG. 1 and FIG. 19A and the tabs 10, which capacitance provides the electrostatic means for deflecting the tabs from silicon substrate 12 to come into contact with the detector electrodes 1 on substrate 3.

Associated with each "D" module on a one-to-one basis is an "S" module—also numbered by the row and column in which it is located. The five-MOSFET, one capacitor "S" module performs the functions described with respect to the single capacitor and MOSFET shown in the simplified illustration in FIG. 3.

Associated with each row of "D" and "S" modules are identical "L" and "R" modules. The "D" and "S" modules for the left half of the array are connected to the "L" module and those for the right half of the array are connected to the "R" module. The "L" and "R" modules provide the means for reading out the integrating capacitors in the "S" modules to the outside world.

An understanding of the overall operation of the readout and frame integration circuitry is best accomplished by first examining the operations that occur in associated "D", "S", and "L" (or "R") modules.

Figure 9:
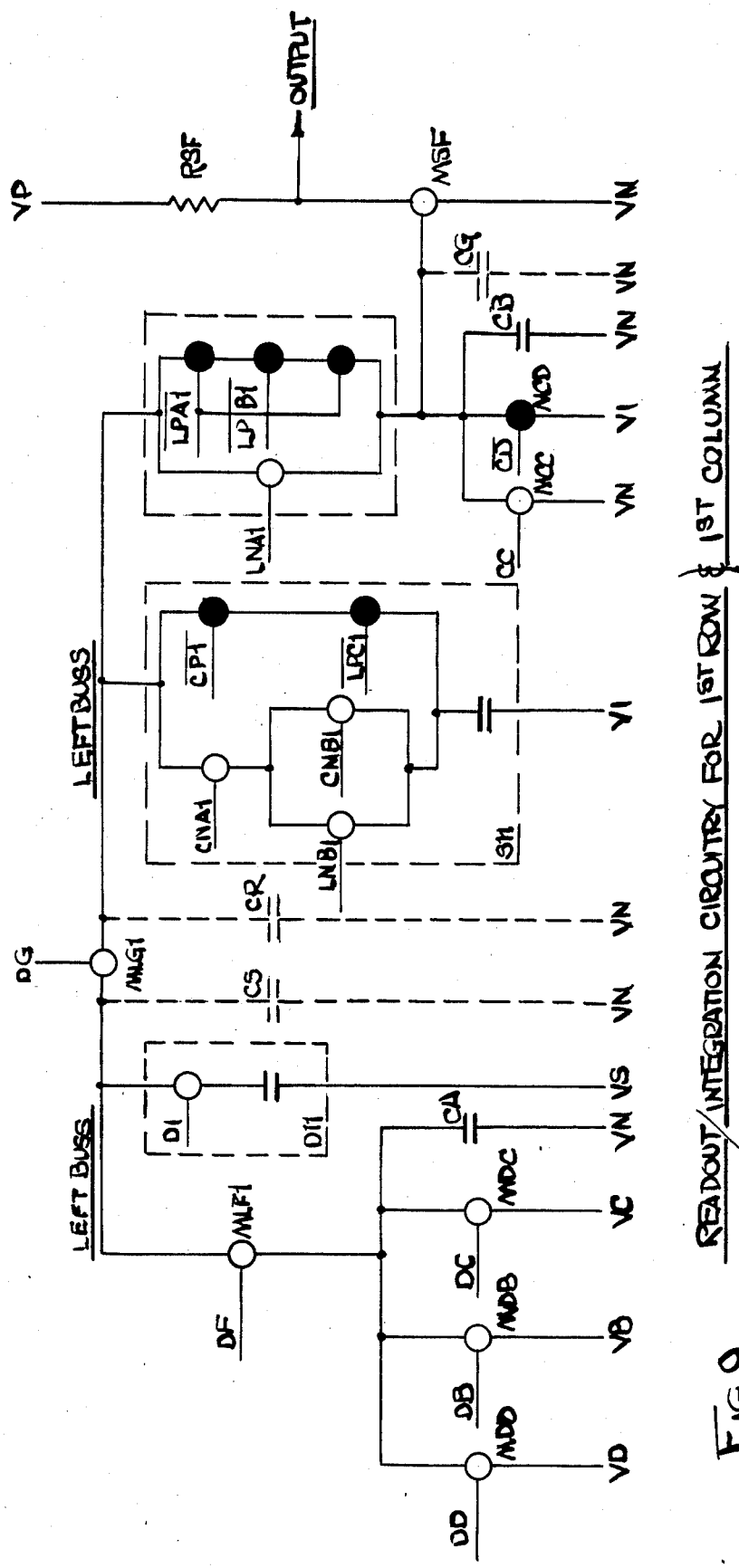
FIG. 9 depicts a "D", "S" and "L" module together with certain ancillary circuitry.

The "D", "S" and "L" modules located in the first row and first column are shown in FIG. 9 together with certain ancillary circuitry included in FIG. 9 to facilitate the description of the circuit operation. The dashed capacitors CS, CR, and CG represent stray capacitance associated with the buses connecting the rows and columns of elements. The detector readout, the integration function that occurs as a result of many detector readouts, and the readout of the integrated charge transfers are accomplished in six steps which take place during a time interval of 1.6 μs.

Figure 10:
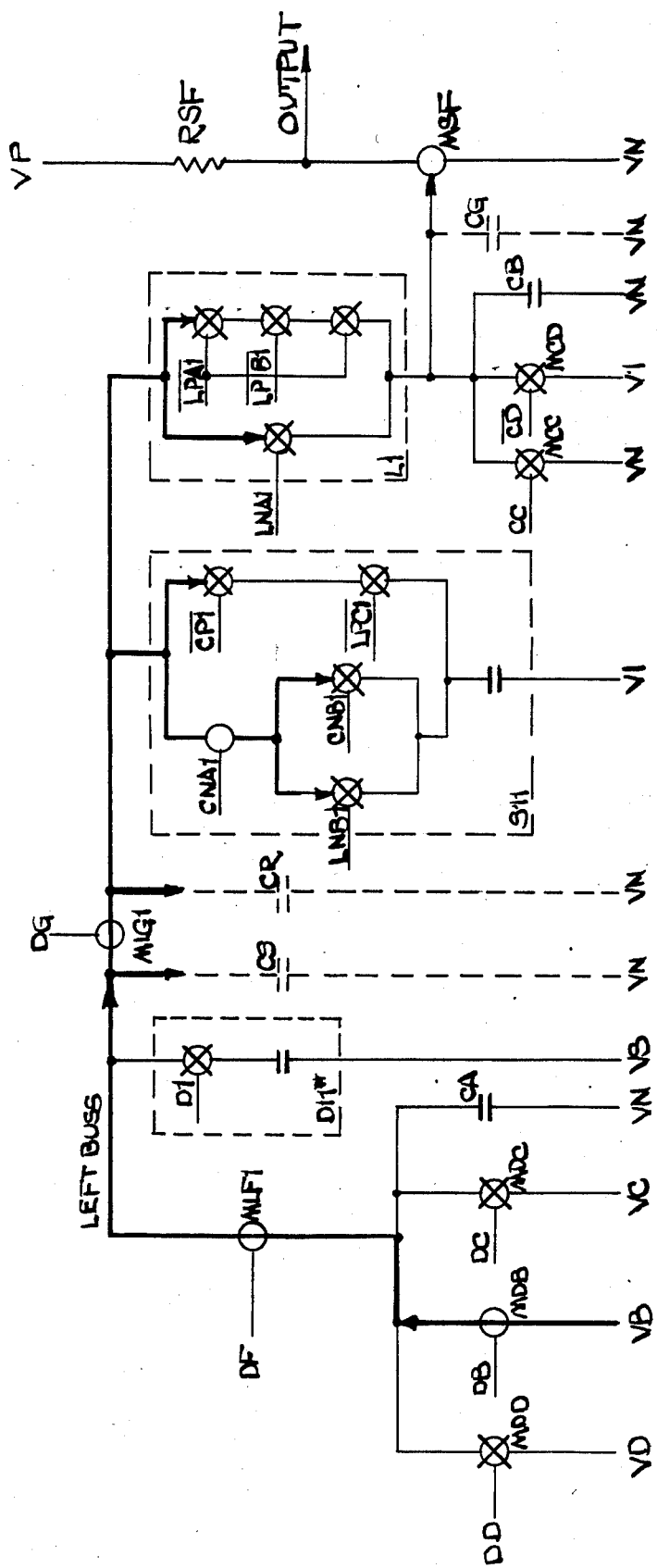

Step 1—Biasing of Stray Capacitance Prior to Detector Readout (FIG. 10)—0 to 0.2 μs Non-conducting MOSFETS are marked with "X's". All other MOSFETS are conducting and the paths of current flow are indicated by the heavy lines and arrows.

The stray capacitance CS and CR associated with the left bus which interconnects left-side "D" and "S" modules with the "L" module is charged to voltage VB which typically is −0.6 volts.

Figure 11:
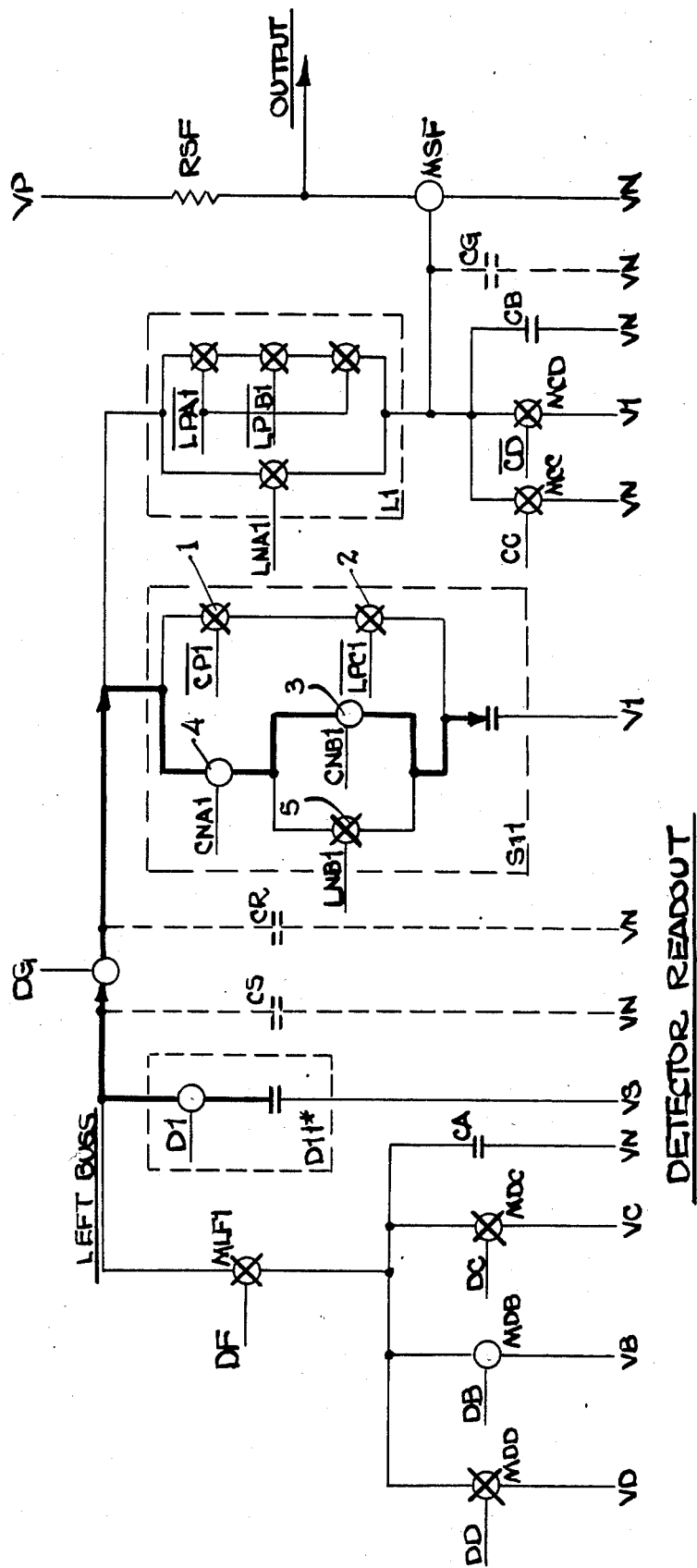

Step 2—Detector Readout (FIG. 11)—0.2 to 0.8 μs

The charge required to discharge the detector is accumulated of the integrating capacity in the "S11" module. MOSFET No. 3 should have as high a width-to-length (W/L) ratio as possible in order to minimize the discharge time of the detector. A ratio of 12 is used in the preferred embodiment, MOSFET No. 4 (W/L=1) serves to inflate the large source-to-substrate capacitance of MOSFET No. 3 from the bus that interconnects the "S" and "D" modules. MOSFET No. 4 is fully turned on and therefore does not significantly affect the discharge time of the detector.

It should be noted that the readout of the detector array proceeds column by column and that all detectors in a column are read out simultaneously.

Step 3—Biasing of Stray Capacitance Prior to Integrating Capacitor Readout (FIG. 12)—0.8 to 1.0 μs Step 3 marks the beginning of the integrating-capacitor readout process. The stray capacitance associated with the left bus is charged to VB. The stray capacitance associated with the output bus is charged to VN.

Step 4—Integrating Capacitor Readout; Detector Charge Dump (FIG. 13)—1.0 to 1.2 μs The integrating capacitor in module "S11" is charged to the voltage to which the left bus was charged in Step 3. The appropriate charge voltage is obtained by adjusting the turn-on-voltage of MOSFET 2 in the "L" module. In order to achieve the lowest practical charge time, MOSFET 2 has a very large W/L value of 70. MOSFETS 1 and 3 with W/L values of approximately one are placed on either side of MOSFET 2 in order to isolate the large source and drain capacitances of MOSFET 2 from the left bus and from the output bus. The fully turned-on MOSFETS 1 and 3 do not significantly affect the charge time.

The amount of charge required to charge the integrating capacitor is accumulated on the storage capacitor CB. The size of capacitor CB is adjusted relative to the integrating capacitor so that the charging of a fully-discharged integrating capacitor does not result in a voltage on CB greater than the charge voltage on the integrating capacitor. For the voltages given in FIG. 13 and for the preferred embodiment, the sum of CB and CG is made twice as large as the integrating capacitor. If this condition is not met, the integrating capacitor would not completely charge under some circumstances.

A second operation, which is independent of the integrating-capacitor readout, but which proceeds in parallel with the readout operation, begins at Step 4 and prepares the just-discharged detectors to collect radiation-created charge again. The step shown in FIG. 13 raises the voltage on the detector to the "flatband" voltage near zero and thereby causes electrons to flood the substrate and recombine with the photon-generated holes; i.e., the holes collected in the detector storage region are "dumped".

Step 5—Integrated Capacitor Readout; Detector Charging (FIG. 14)—1.2 to 1.4 $\mu$s The readout operation involving the integrating capacitor and CB that began in Step 4 continues. The detector is readied for operation by charging it to a negative voltage VC.

Step 6—Integrating Capacitor Discharged (FIG. 15)—1.4 to 1.6 $\mu$s

The readout operation involving the integrating capacitor that takes place during Steps 4 and 5 leaves the integrating capacitor charged. In order to prepare the integrating capacitor for the next integration cycle, it is discharged by applying the voltage VI to the upper plate.

It should be noted that the operations involved in reading out an integrating capacitor to CB is accomplished for only one capacitor at a time.

Sampling the output voltage of the source follower at the end of Step 5 provides a measure of the charge that was read out from the integrating capacitor.

Figure 16A:
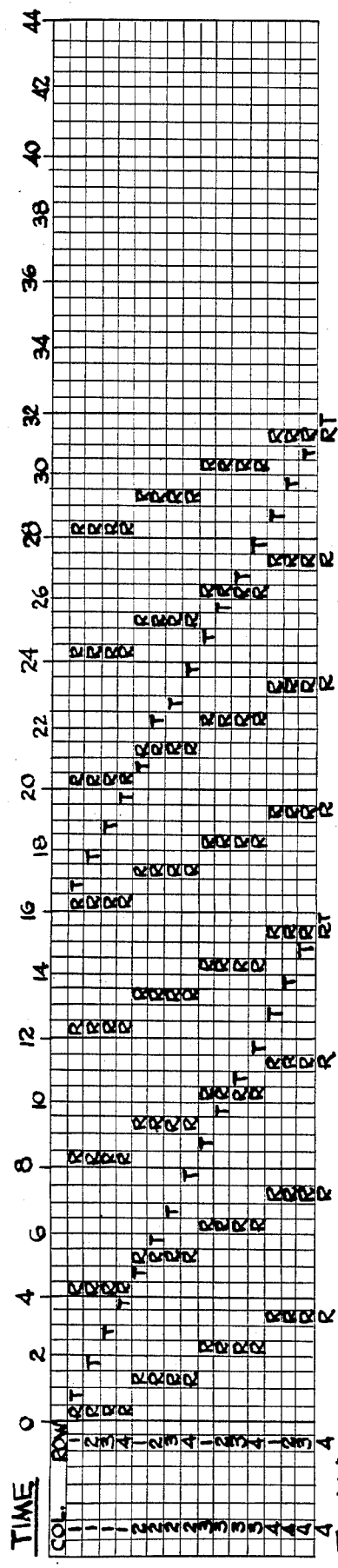
FIGS. 16 and 17 depict the timing and control signals and their relationship.
Figure 16B:
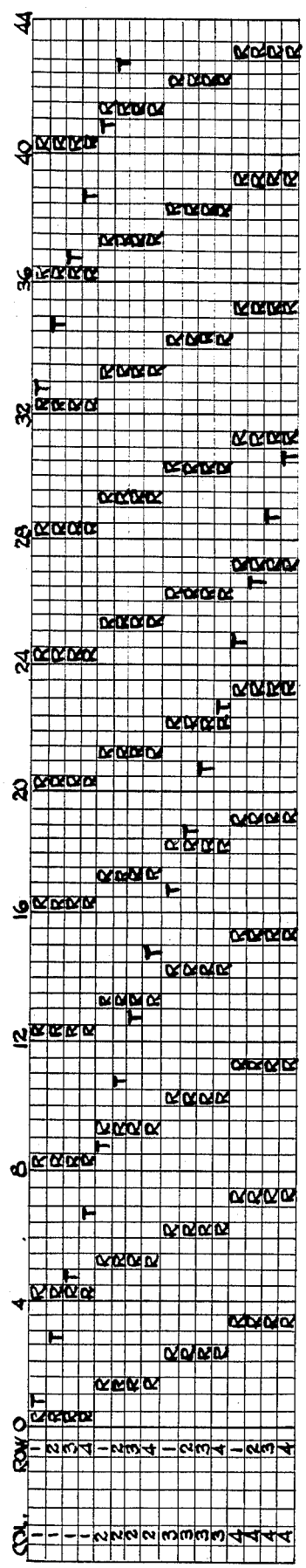
Figure 16C:
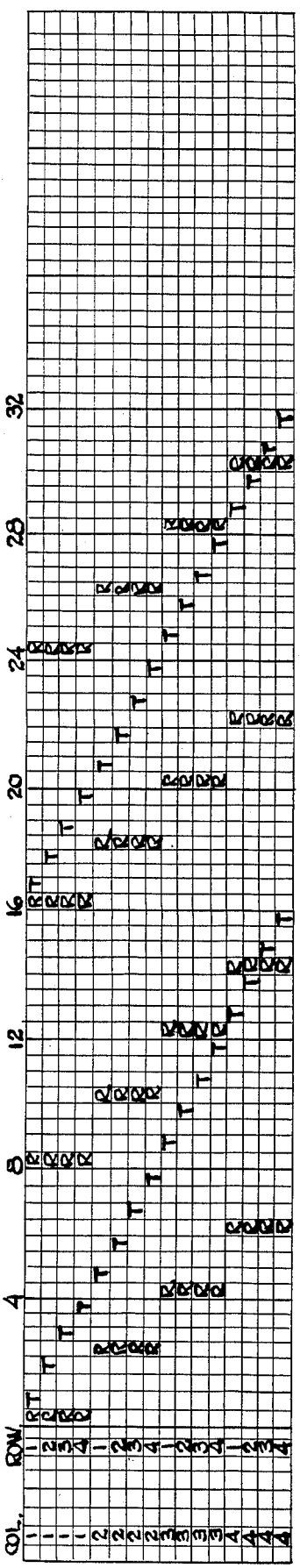

FIG. 16 illustrates how the operations outlined in FIGS. 10–15 translate to the operation of an array.

For simplicity, the detector readout (R) is represented as taking place during the first half of a time period and integrating capacitor charge transfer (T) as taking place during the second half although actually in some overlap in these operations. FIG. 16, depicts how the timing of readout and charge transfer is affected by the number of frames integrated. Note how a column of detectors are all read out at one time, while charge transfer involves only one integrating capacitor at a time. The patterns shown in FIG. 16 for a 4×4 array provide the insight necessary to derive the timing pattern for larger arrays.

Figure 17A:
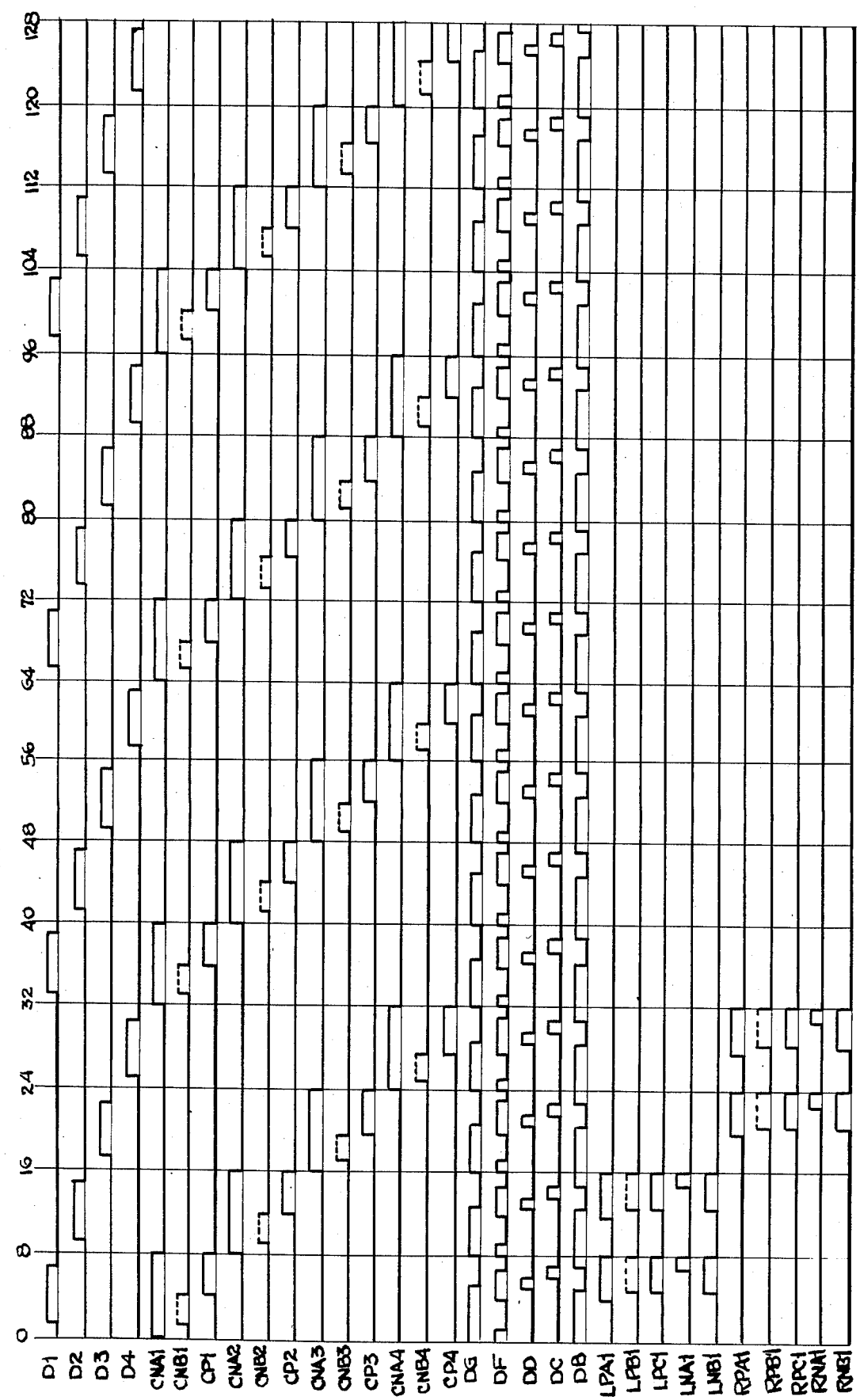
Figure 17B:
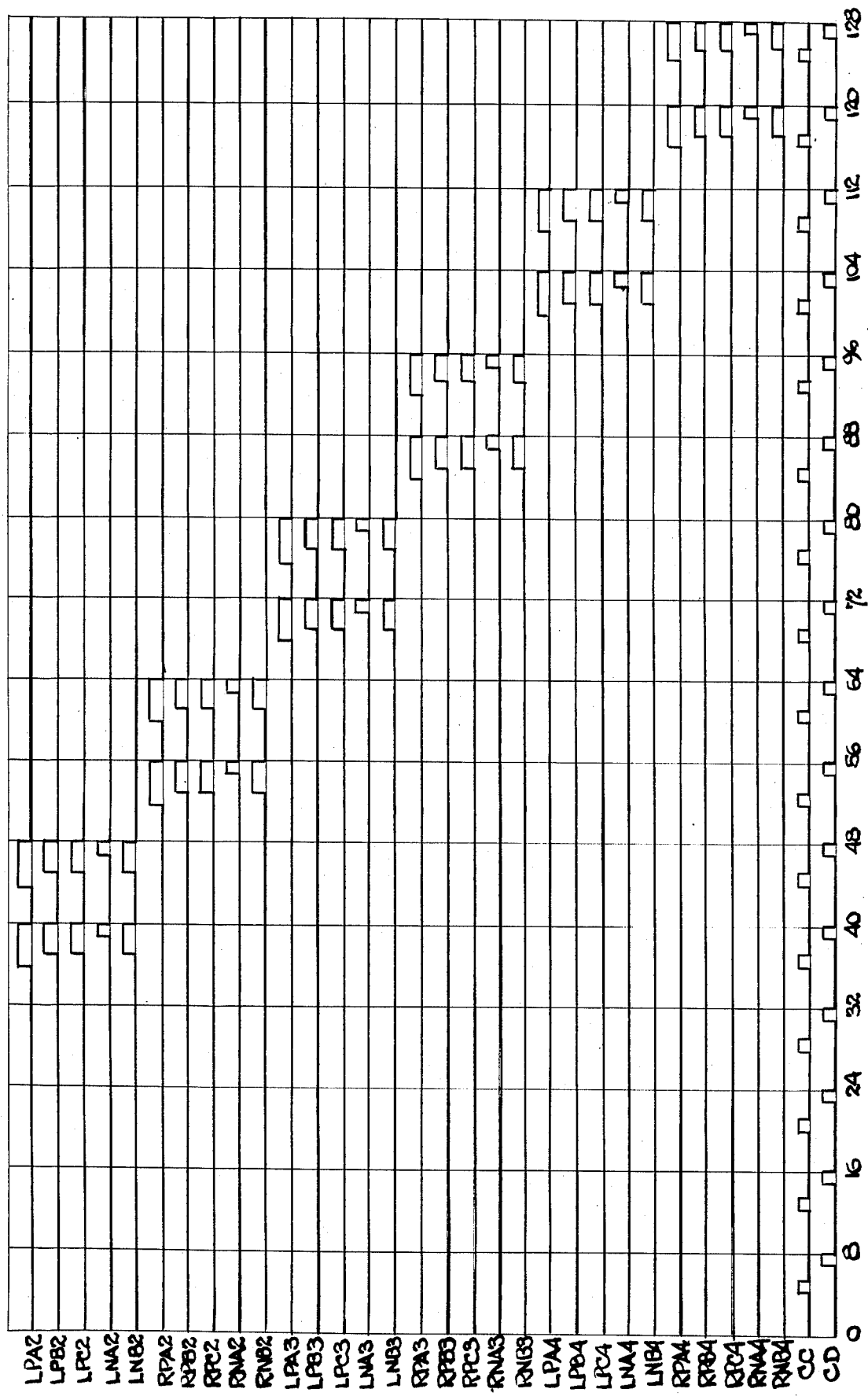

The control signals for a 4×4 array (see FIG. 8) which implement the operations outlined in FIGS. 10–15 are shown in FIG. 17. The number of frames integrated is four in the example shown. In FIG. 17, when the control signal is "high", the MOSFET is turned on and when the control signal is "low", the MOSFET is turned off. Where the voltage level in FIG. 17 is shown as a dotted line, the turn-on voltage has been adjusted so as to achieve automatic turn-off when the source reaches a particular voltage level.

Figure 18:
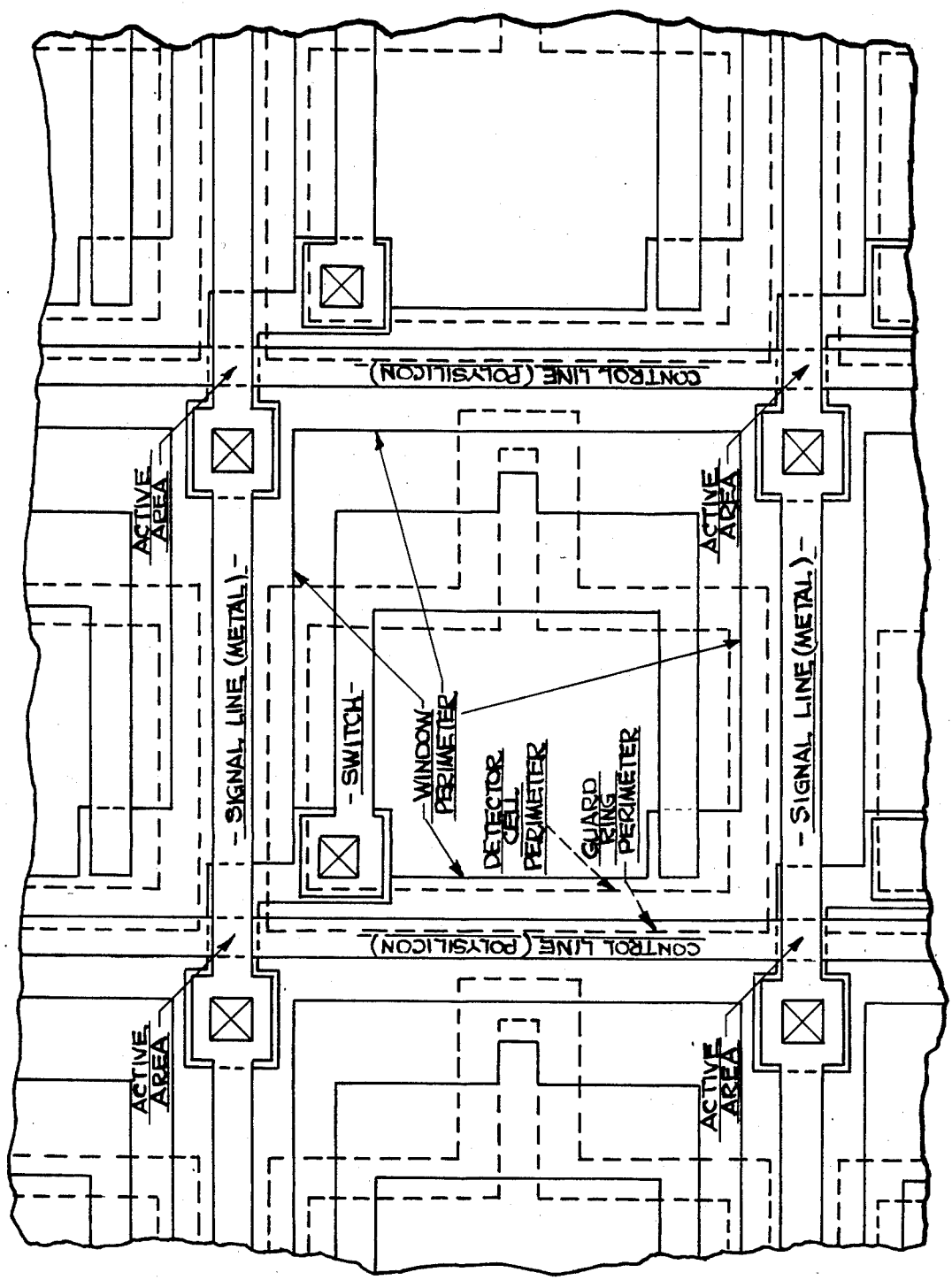
FIG. 18 shows the layout of a "D" module.

Circuit Layout (FIG. 18)

The circuit layout for the "D" module is shown in FIG. 18 for 3-um minimum feature dimensions. The scale of the circuit is indicated by the dimensions shown on the Figure. The outlines of the detector cells and guard rings are shown to provide orientation. A portion of the detector array is shown in FIG. 19. The heavy croshatched areas represent insulator over semiconductor. All other areas represent metal over insulator over semiconductor. The area of the detector cell is 643.5 $\mu m^2$. The area within the window that is not shadowed by the switch is 437 sq. $\mu m$. The dimensions of the "D" module are 42 $\mu m \times 42$ $\mu m$.

Figure 20:
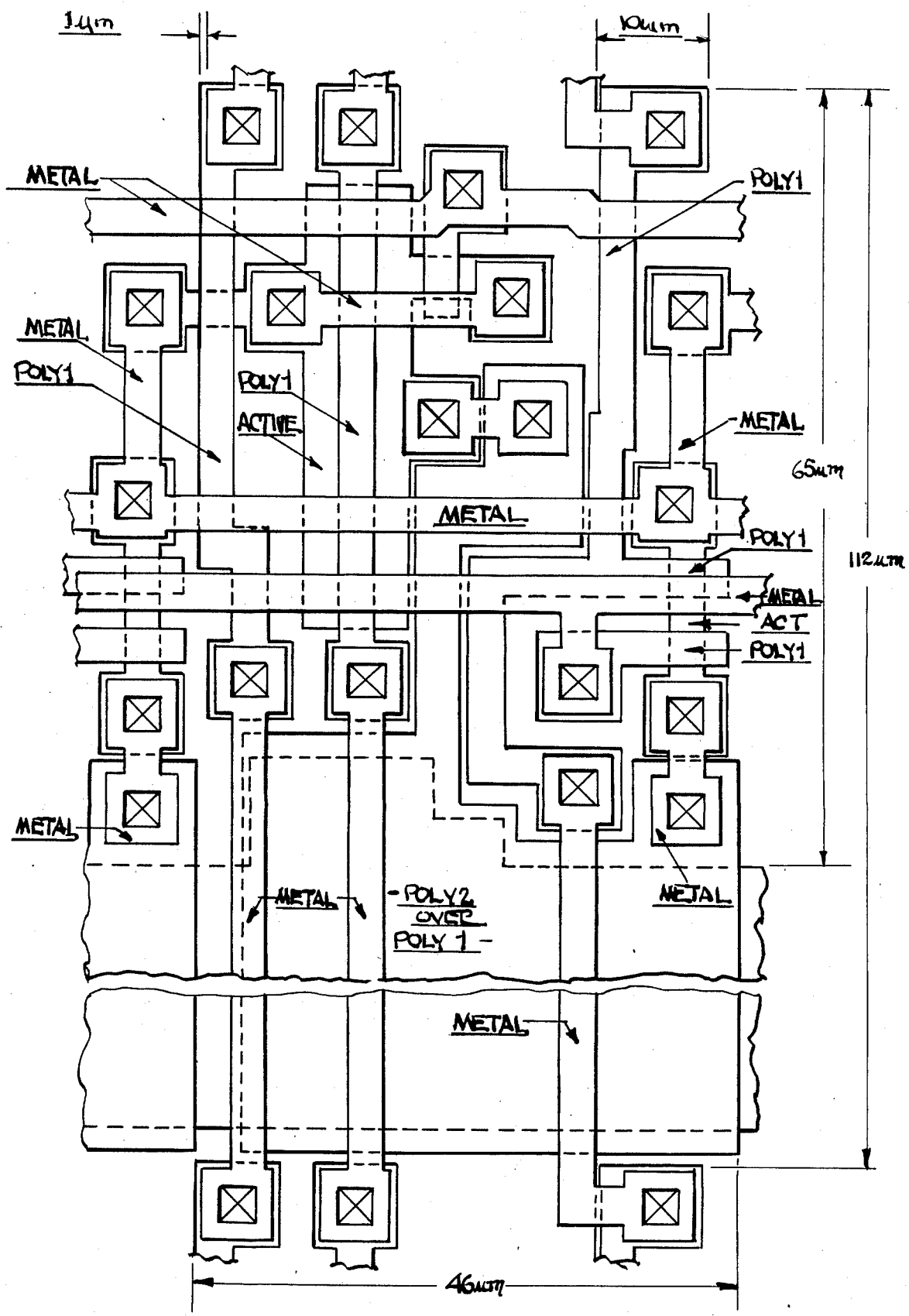
FIG. 20 depicts the layout of an "S" module.

The layout of the "S" module is shown in FIG. 20. The size of the module is 46 $\mu m \times 112$ $\mu m$. The area of the integrating capacitor is 2100 $\mu m^2$ (approximately 1 pF of capacitance).

Figure 21:
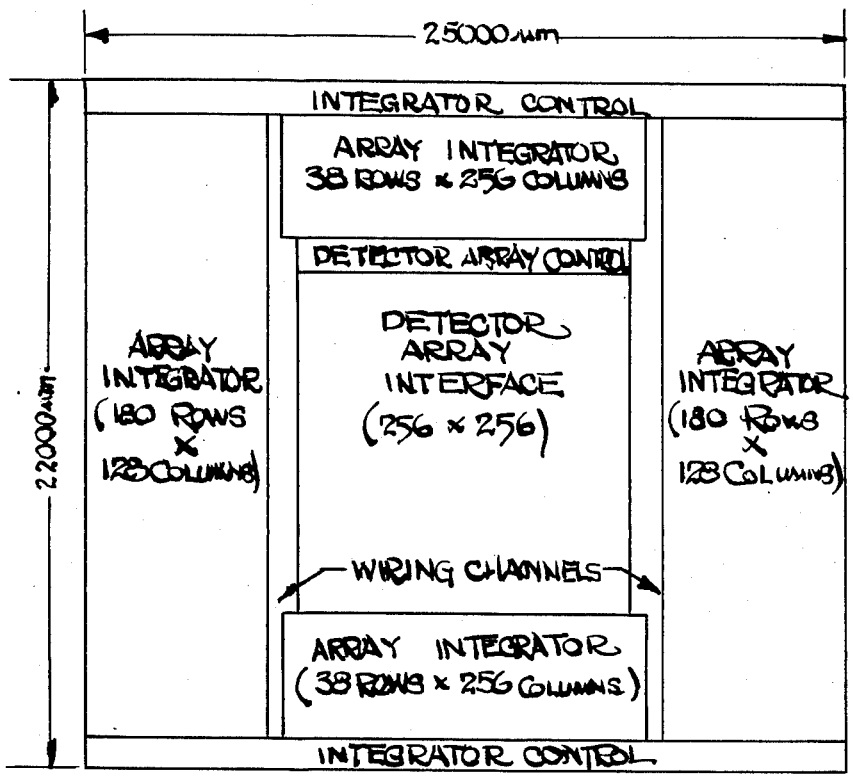
FIG. 21 is a floor plan of the entire chip.

For the configuration of the "D" and "S" modules are shown in FIG. 21, a chip has the dimensions of 22000 $\mu m \times 25000$ $\mu m$. This total area is allocated as follows:

| | |
|---|---|
| 65,536 1pF capacitors @ 2100 $\mu m^2$/cap. = | 137 × 10$^6$ $\mu m^2$ |
| 65,536 windows @ 1019 $\mu m^2$/detector = | 67 × 10$^6$ $\mu m^2$ |
| 400,000 MOSFETS and interconnections = | 346 × 10$^6$ $\mu m_2$ |
| TOTAL | 550 × 10$_6$ $\mu m_2$ |

I claim:
1. An infrared imaging device comprising
   a semiconductor substrate,
   an insulating layer disposed on one side of said substrate,
   a plurality of discrete electrodes formed and laid on said insulating layer, said electrodes being substantially transparent to infrared radiation,
   a second substrate,
   a plurality of integrating capacitors disposed on a second substrate mounted in alignment over the semiconductor substrate so that the electrodes and integrating capacitors are in general aligned positions to coincide with each other,
   a plurality of means for connecting each electrode to a respective one of said capacitors to a charging voltage and for thereafter discharging each said electrode, the charge so accumulated on each capacitor being related to the charge collected at the insulating layer-substrate interface beneath the electrode due to interaction by radiation passing therethrough,
   means for creating a depletion layer in the substrate and for floating each of the electrodes,
   means for reading out each detector by measuring the amount of charge that needs to be placed on the electrode to partially discharge the electrode to a predetermined voltage,
   means for adjusting the initial electrode voltage and the voltage to which the electrode is partially discharged to obtain an approximately linear relationship between the charge which is transferred to the electrode and the amount of charge which is accumulated the insulating layer-substrate interface beneath the electrode due to incident radiation.

2. The imaging device as in claim 1 further including an array of conducting guard rings located on the exterior surface of the layer of insulation and separating the individual electrodes from each other.

3. The imaging device as in claim 1 further including switching and supply means for periodically discharging each electrode, through its associated integrating capacitor, down to a preselected discharge voltage, and for reinitializing the electrode.

4. The device described in claim 3 wherein the switching and supply means comprises, discharging and charging means for periodically setting the voltage of each electrode to a preselected value so as to form a depletion layer in the semiconductor substrate in the vicinity of each electrode, floating each electrode for a detection period during which the depletion layer is reduced in extent by incident infrared radiation and during which detection period charge is accumulated at the surface of the semiconductor next to the layer of insulation in the vicinity of each electrode, discharging each electrode through its associated integrating capacitor down to a preselected electrode voltage, momentarily reversing the polarity of the voltage on each electrode so as to remove any charge accumulated at the surface of the semiconductor and resetting the voltage on each electrode to the preselected value to reestablish the depletion layer.

5. The device described in claim 2 and further comprising array readout means for periodically reading out the charge accumulated on each integrating capacitor and for resetting each integrating capacitor to zero.

6. The device described in claim 1 wherein said second substrate is located adjacent to the array of electrodes and each of said integrating capacitors is connected to its associated electrode by means of the switching and supply means and connected through an array of metal tabs, which tabs are located on the surface of the second substrate and deflected into contact with the electrodes by electrostatic means for deflecting the tabs.

7. The device described in claim 6 wherein the switching and supply means include an array of solid-state switches, each switch of the array being associated with one of the metal tabs and being located on the second substrate in proximity to its associated metal tab and each switch operating periodically to connect the associated metal tab electrically to the switching and supply means and operating periodically to isolate the associated metal tab electrically from the switching and supply means.

* * * * *